United States Patent [19]

Beyer et al.

[11] Patent Number: 6,146,714
[45] Date of Patent: Nov. 14, 2000

[54] METHOD OF FORMING METAL, CERAMIC OR CERAMIC/METAL LAYERS ON INNER SURFACES OF HOLLOW BODIES USING PULSED LASER DEPOSITION

[75] Inventors: Steffen Beyer, Munich; Reiner Dietsch; Hermann Mai, both of Dresden; Wolfgang Pompe, Kurort Hartha, all of Germany

[73] Assignee: DaimlerChrysler AG, Stuttgart, Germany

[21] Appl. No.: 09/235,978

[22] Filed: Jan. 22, 1999

[30] Foreign Application Priority Data

Jan. 22, 1998 [DE] Germany ............................ 198 02 298

[51] Int. Cl.[7] .................................................. C23C 16/48
[52] U.S. Cl. ......................... 427/554; 427/586; 427/596; 427/230; 427/237
[58] Field of Search ..................................... 427/230, 237, 427/238, 239, 508, 509, 554, 586, 596

[56] References Cited

U.S. PATENT DOCUMENTS

| | | | |
|---|---|---|---|
| 4,340,617 | 7/1982 | Deutsch et al. | 427/584 |
| 5,372,862 | 12/1994 | Krishnaswamy | 427/596 |
| 5,578,350 | 11/1996 | Mai et al. | 427/596 |
| 5,620,754 | 4/1997 | Turchan et al. | 427/596 |
| 5,733,609 | 3/1998 | Wang | 427/586 |
| 5,780,120 | 7/1998 | Belouet et al. | 427/554 |

FOREIGN PATENT DOCUMENTS

| | | |
|---|---|---|
| 2607830 | 6/1988 | France . |
| 293608 | 9/1991 | Germany . |
| 295666 | 11/1991 | Germany . |
| 4339490 | 3/1995 | Germany . |
| 4417114 | 11/1995 | Germany . |
| 62-174369 | 7/1987 | Japan . |
| 2250751 | 6/1992 | United Kingdom . |

*Primary Examiner*—Shrive Beck
*Assistant Examiner*—Bret Chen
*Attorney, Agent, or Firm*—W. F. Fasse; W. G. Fasse

[57] ABSTRACT

A pulsed laser deposition (PLD) process is used for forming a functional metal, ceramic, or ceramic/metal layer on an inner wall of a hollow body. Simultaneously with the deposition process, a thin-film laser treatment is carried out, whereby a laser beam impinges on the coating layer as it is being formed to achieve a rapid heating followed by a rapid cooling and solidification of the deposited coating layer. In this context, the energy and material flux densities are prescribed and controlled as a function of the spacing of the condensation region from the substrate surface. Laser pulses having an energy of 1 to 2 Joules and a pulse repetition rate of 10 to 50 Hz are used. The pulse duration as well as the residual gas atmosphere in the vacuum deposition chamber are controlled so that the generated plasma flux forms the desired layered grain structure, namely a glassy amorphous structure, a columnar structure, or a polycrystalline structure. The coating or target material can be made of a conducting material and/or an insulating material. By continuously or discretely varying process parameters, it is possible to form graded layer coating systems having properties that vary through the thickness of the coating.

23 Claims, 2 Drawing Sheets

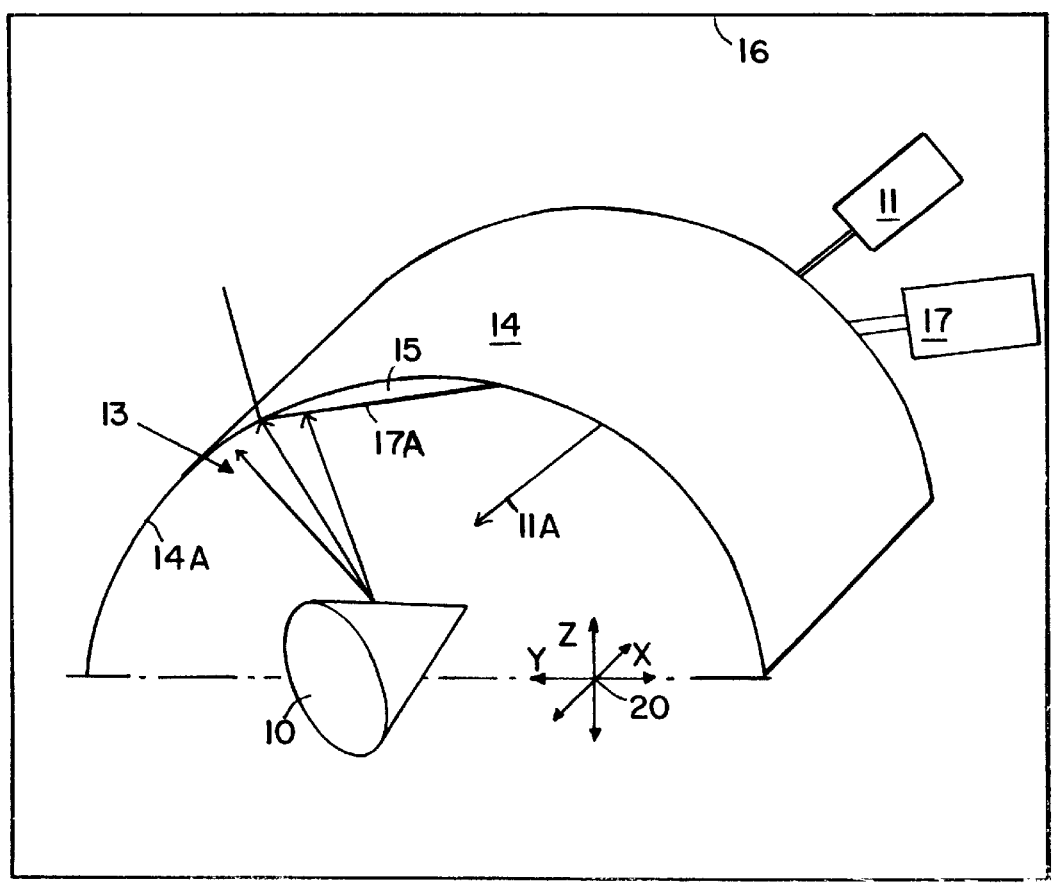

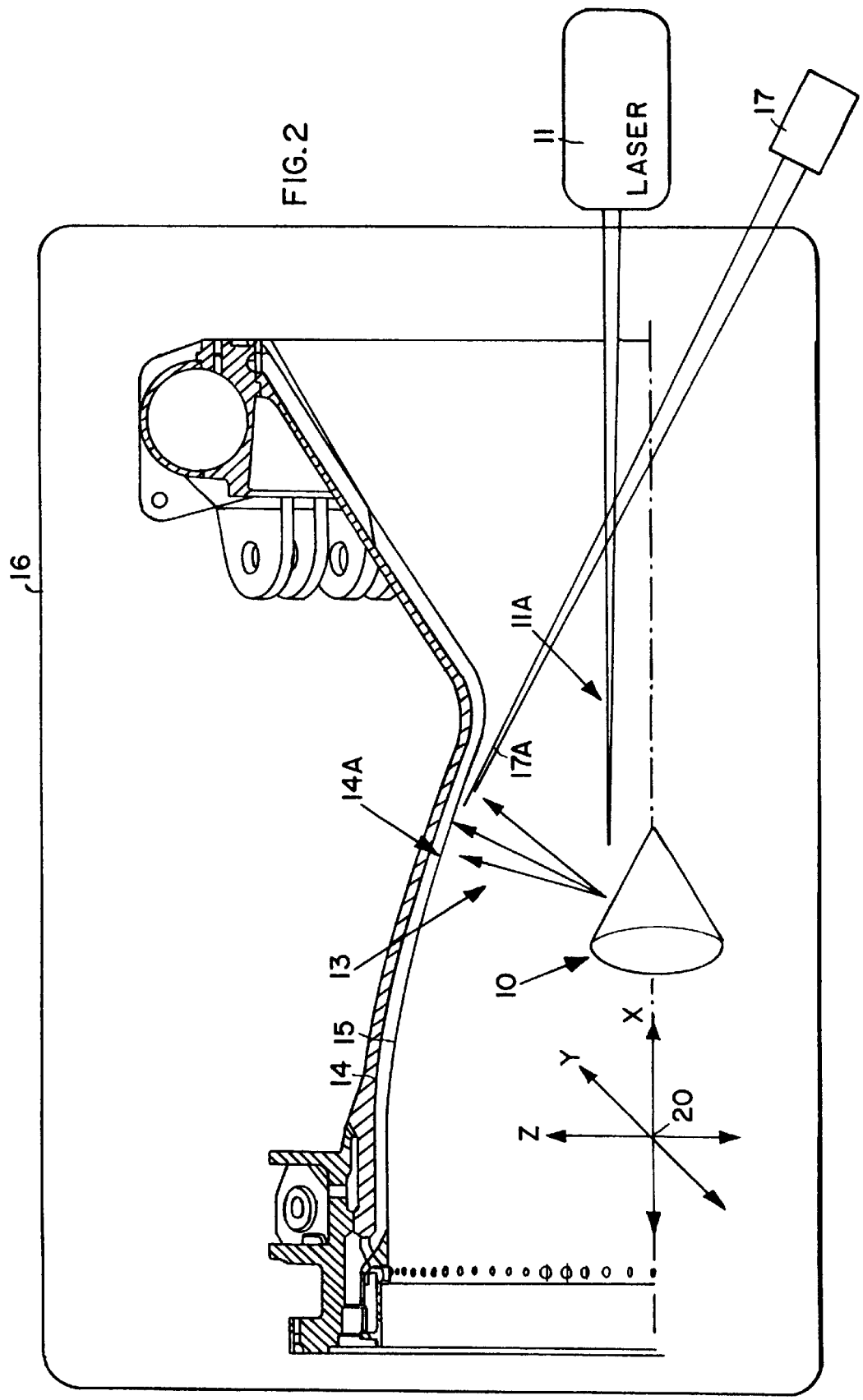

METHOD OF FORMING METAL, CERAMIC OR CERAMIC/METAL LAYERS ON INNER SURFACES OF HOLLOW BODIES USING PULSED LASER DEPOSITION

This application is based on and claims the priority under 35 U.S.C. §119 of German Patent Application 198 02 298.0, filed on Jan. 22, 1998, the entire disclosure of which is incorporated herein by reference.

FIELD OF THE INVENTION

The invention relates to a method for forming functional metal, ceramic, or ceramic/metal layers on inner surfaces of hollow bodies using pulsed laser deposition (PLD).

BACKGROUND INFORMATION

Methods of the above mentioned general type, using pulsed laser deposition (PLD) for coating the inner wall surfaces of hollow bodies, and particularly for coating hollow bodies having small dimensions with thin coating layers, are generally known in the art. For example, German Patent Publication 43 39 490 discloses a method and an apparatus for carrying out the coating of interior walls of hollow bodies having small dimensions, e.g. less than 10 mm, whereby the coating is carried out by means of PLD, and whereby uniform coating layers with defined adjustable or selectable layer thicknesses can be deposited over the entire surface to be coated.

Furthermore, German Patent Publication 44 17 114 discloses a method and an apparatus for achieving a particle selective deposition of thin coating layers by means of PLD, whereby the number of droplets and target particles in thin layers can be reduced by an order of magnitude. This is achieved according to the known method in that a laser pulse generates a laser plasma on a surface of a target material, whereupon this laser plasma is directed into a partial chamber space lying above the substrate surface, and a process gas is introduced into this partial chamber space, in order to develop a high frequency electrical field in this space.

Until the present time, the problems associated with coating the inner walls of hollow bodies with well-adhering, chemically and physically homogeneous functional layers have only been solved somewhat satisfactorily in a few special cases or applications. It is especially noted that considerable problems still arise in connection with the application of one or more coating layers onto the inner walls of hollow bodies having small inner diameters, and in connection with the deposition of composites or alternating layers on such substrates of glass and ceramic materials, and further in connection with the synthesis of ceramic and metal/ceramic layers having a defined grain structure with a prescribed physical structure on the interior walls of any desired materials.

SUMMARY OF THE INVENTION

In view of the above, it is an object of the invention to provide a method of forming or depositing metal, ceramic or ceramic/metal layers on inner surfaces of hollow bodies using pulsed laser deposition, which makes it possible to achieve a direct homogeneous internal coating of hollow bodies having complex geometries with a local coating applied to the smallest possible areas. It is a further object of the invention to provide such a method that meets the highest requirements with regard to surface quality, reproducibility, adhesion of the deposited coating layers, and resistance against extreme thermal and chemical loading. The invention further aims to avoid or overcome the other disadvantages of the prior art, and to achieve additional advantages, as apparent from the present description.

The above objects have been achieved in a method according to the invention, using pulsed laser deposition for depositing functional metal, ceramic or ceramic/metal coating layers onto the inner surfaces of hollow bodies, and using a simultaneous or immediately subsequent laser treatment of the deposited coating layers. Namely, a primary pulsed laser beam is directed at a target material so as to vaporize material from the target and generate a plasma containing the target material, the target material or coating material condenses out of the plasma to deposit a coating layer on the inner wall surface of the hollow body, and an auxiliary laser beam is directed at the inner wall surface of the hollow body on which the coating layer has been or is being deposited. The auxiliary laser beam thus achieves an after-treatment of the just-formed coating layer, and/or pre-heats the surface on which the coating layer is deposited, whereby the deposition and bonding of the coating material onto the surface are improved. The auxiliary laser beam may be formed by simply redirecting the entirety or a beam-split portion of the primary pulsed laser beam, e.g. using a mirror or the like, or by generating a distinct laser beam with a separate second laser source.

According to particular further features of the invention, the energy and material flux densities for the pulsed laser deposition process are prescribed and controlled as a function of the spacing of the laser plasma condensation region from the substrate surface, and the pulsed laser deposition process uses laser pulses having an energy of 1 to 2 Joules and a pulse repetition rate of 10 Hz to 50 Hz. The pulse duration is controlled and selected as necessary, and a residual gas atmosphere is provided in the vacuum deposition chamber, so that the plasma flux forms a desired typical layered grain structure, selected from among a glassy amorphous structure, a columnar structure, or a polycrystalline structure. The coating source material or target material can be made of either or both of electrically conducting substances and/or electrically insulating substances.

The target material as well as the two lasers are each arranged to be controllably movable in three dimensions, and preferably along three Cartesian coordinate axes. In this manner, the target material can be moved along the X-axis, for example parallel to a lengthwise axis of the hollow body to be coated, while also being moved radially closer to or farther away from the surface that is to be coated and circumferentially around or along the surface to be coated. Thereby, the target material can be moved as necessary to maintain the proper spacing relative to the surface to be coated, as the target material moves along the varying contours of the surface so that the area of deposition scans over the surface to be coated. Meanwhile, the primary pulsed laser beam is directed as needed to impinge upon the target material, and the target material is preferably rotated to achieve the greatest uniformity and homogeneity of the deposited coating layer. By either discretely or continuously varying process parameters such as the laser energy density, the pulse duration, and/or the residual gas atmosphere, a graded layer system can be deposited on the inner surface of the hollow body, whereby the layer system exhibits a discrete or continuous variation in its composition, crystal structure or other properties.

BRIEF DESCRIPTION OF THE DRAWINGS

In order that the invention may be clearly understood, it will now be described in connection with two example embodiments, with reference to the accompanying drawings, wherein:

FIG. 1 is a schematic diagram illustrating the method of the invention for forming functional ceramic or metal layers on the inner wall of a hollow body using pulsed laser deposition; and FIG. 2 is a schematic diagram of a particular example of applying thermally and chemically insulating coating layers on the internal surfaces of a rocket combustion chamber using pulsed laser deposition.

DETAILED DESCRIPTION OF PREFERRED EXAMPLE EMBODIMENTS AND OF THE BEST MODE OF THE INVENTION

According to the general concept of the invention, a pulsed laser deposition (PLD) process is used in combination with a laser thin-film treatment for applying ceramic, metal and/or metal/ceramic layers having defined functional characteristics, grain characteristics, and structural characteristics on the interior surfaces of hollow bodies. In this manner, a broad range of substantial advantages of the PLD process, as well as improved adhesion and other advantages, are achieved in the present coating method. It should be especially emphasized that, according to the invention, it is now possible to realize precisely controllable thermodynamic process conditions even in a micro-reaction volume. This is made possible especially by the use of prescribed energy and material flux densities as a function of the spacing of the condensation region from the substrate surface in the PLD process. Since this process operates in a short duration pulse regime, the highest possible particle and energy densities are realized in the condensation region of the substrate surface.

By using the PLD process it is possible to achieve an effective coating of the inner wall surfaces of hollow bodies having small inner dimensions and/or complicated geometries, whereby the coating materials have a high chemical and physical purity. As an example, using the present method, it is possible to coat the inner surfaces of hollow bodies having a length greater than 500 mm and even up to 650 mm, and an inner diameter of less than 10 mm and as little as 7 mm. In this method, the coating or target material can be made of conducting or insulating substances. The generation of the plasma flux is provided by any desired coating material or materials that can be laser-plasma processed in a vacuum. In other words, the target materials are only limited by their usefulness or suitability in a vacuum. Using a special apparatus, the present inventive method can also be used for achieving the internal coating of a hollow body that is open at only one end, and closed at the other end.

A concrete example embodiment of the invention will now be described in connection with the schematic diagram of FIG. 1. A target 10, such as a generally cone-shaped target material of a $ZrO_2$ ceramic, is arranged in a hollow body 14 having an inner wall surface 14A that is to be coated, and the target 10 and hollow body 14 are both received in a substantially evacuated deposition chamber 16. The target 10 is impinged upon by a pulsed laser beam 11A that is emitted by a solid state laser, a $CO_2$-TEA laser, or an excimer laser 11 and that is then directed into the deposition chamber 16 through a laser window or the like. Preferably, to improve the uniformity and homogeneity of the deposition process and the resulting deposited coating layer, the target 10 is rotated while it is subjected to the pulsed laser beam 11A. Preferably, the pulsed laser beam 11A uses laser pulses with energies in the range from 1 to 2 Joules, with a pulse repetition rate in the range from 10 to 50 Hz. The pulse duration is controlled to be on the order of magnitude of nanoseconds (ns) or microseconds ($\mu s$).

By adjusting or controlling the pulse duration, material is vaporized from the target 10 to form a plasma and particularly a plasma flame or plasma jet 13. This is achieved further by providing an appropriate residual gas atmosphere in the evacuated deposition chamber 16, while optionally also applying an electrical field or establishing any other necessary conditions for generating and directing a plasma, as generally known to persons of ordinary skill in the art.

The generated plasma jet 13 is directed at the inner wall surface 14A of the hollow body 14, whereupon the vaporized or plasma-form material condenses on the inner wall surface 14A and thus leads to the growth of a thin $ZrO_2$ layer 15 thereon. By appropriately selecting the pulse duration of the pulsed laser beam 11A, other operating parameters of the laser beam, and the residual gas atmosphere in the deposition chamber 16, any desired typical layered grain structure, for example glassy amorphous, columnar, or polycrystalline, can be achieved in the thin $ZrO_2$ layer 15. It is further possible to deposit a graded layer system with a continuous variation of the characteristics or properties through the thickness of the overall layer system by carrying out a discrete or continuous variation of selected process parameters, and particularly the laser energy density, the pulse duration, and the composition of the residual gas atmosphere.

Further according to the invention, the target energizing laser 11 itself, or preferably an additional auxiliary laser 17 is used to generate an auxiliary laser beam 17A which is directed at the inner surface 14A of the hollow body 14, such that this secondary or auxiliary laser beam directly irradiates the $ZrO_2$ layer 15 that is being formed. In this manner, the beam energy of the auxiliary laser beam 17A imparted to the inner surface 14A of the hollow body 14 and to the ceramic coating layer 15 being formed causes a correspondingly rapid heating of the layer surface and then a subsequent rapid solidification of the layer surface once the auxiliary beam moves to a different location. This rapid heating followed by a rapid cooling and solidification leads to a "freezing-in" of the grain structure and other properties of the overheated layer structure, which effectively conserves or retains at least certain properties of the temporary molten condition. Moreover, the rapid heating of the formed ceramic coating layer 15 to the molten state uniformly distributes the material of the layer 15 and homogeneously covers and closes the original porous surface of the layer, whereafter the rapid cooling and solidification achieves a uniform and smooth sealing of the original porous surface. In this context, the dimensions of the laser treatment zone are defined by the absorption depth of the respective utilized wavelength of the laser light into the layer surface, and the beam cross-section on the layer.

It should be understood that the term "gradient materials" refers to heterogeneous composite materials in which the mechanical, physical and chemical material properties vary continuously through the material, and in which no discontinuities exist in the material. Moreover, a "functional gradient material" refers to a material in which a grain gradient is so selected or adjusted to achieve property combinations, for example of a layer having a high thermal insulating value being deposited with good adhesion on a metallic base or substrate matesial. Such grain size or grain type gradients can be achieved according to the method of the invention, and therefore allow gradient layers to be applied with a good adhesion characteristic even on dissimilar base or substrate materials.

As is only schematically represented in FIG. 1 by the Cartesian coordinate system 20, the target 10 as well as the primary laser 11 and the auxiliary laser 17 are each movable in three-dimensions, for example along the Cartesian coordinate axes X, Y and Z, relative to the hollow body 14. Alternatively, the movements of these components can be carried out along a cylindrical or spherical coordinate system, as best applicable to the particular hollow body being treated. The relative motion between the target 10 and the substrate formed by the hollow body 14 is preferably carried out by appropriate stepper motors or some other servo-drive that is driven by commands issued by a computer control such as a CNC computer numerical controller typically used for moving machine tools or the like. The movement of the target 10 relative to the hollow body 14 in the three dimensions is carried out so as to sequentially move the target 10 around and along the inner surface 14A of the hollow body 14 in a scanning manner, so that the plasma jet 13 deposits the coating sequentially or scanningly over the entire inner surface 14A that is to be coated. To achieve this, and to maintain the desired plasma and coating properties, the distance between the target 10 and the inner surface 14A of the hollow body 14 is also adjusted as necessary as the target 10 moves scanningly over or along the varying inner contour of the inner surface 14A. Meanwhile, the primary laser 11 (or an intermediate mirror) is oriented as necessary to keep the laser beam 11A properly impinging on the target 10, and the auxiliary laser 17 (or an intermediate mirror) is properly moved to scan the auxiliary beam 17A along the inner surface 14A together with the plasma jet 13.

A further example embodiment of the inventive method relates to the particular example of applying an internal coating on the inner surfaces of a combustion chamber, and particularly a rocket combustion chamber representing the hollow body 14, as shown schematically in FIG. 2. The combustion chambers of high power engines are subjected to extreme thermal loading and chemical attack during operation. As a result, the expected operating life of such combustion chambers is sharply limited. The inventive method makes it possible to apply a thermally insulating and chemically resistant material coating layer onto the inner surfaces of the highly thermally conducting combustion chamber walls, and thereby the operating life of such a combustion chamber may be substantially increased. For example, according to the invention it is possible to deposit a ceramic layer or a high temperature resistant metal or metal/ceramic layer 15 onto an inner surface 14A of a thermally conducting copper substrate such as the inner wall of a combustion chamber. According to the invention, good adhesion of the coating layer is achieved, despite the dissimilarity and mismatch between the coating material and the substrate material in general, because a gradient layer structure can be achieved.

In this application particularly, the pulsed laser deposition process achieves several advantages. Previously, the layer thickness d of a coating layer that could be achieved was limited to a maximum $d_{max}$ of approximately 20 $\mu$m due to the high thermal flux densities. On the other hand, the method according to the invention makes it possible to achieve a precise preparation of very thin homogeneous layers, for example having a thickness d approximately equal to a single atomic monolayer, up to a great thickness of approximately 100 $\mu$m. Moreover, the inventive method makes it possible to synthesize functional graded layers or multi-layer coating systems with total thicknesses in the range of 1 to 100 $\mu$m in order to limit or reduce stress peaks at the layer interfaces and particularly at the face between the substrate and the first layer adjoining onto the substrate.

As a second advantage, the finished surface of the deposited coating layer has a very high surface quality and smoothness in the nanometer range. Moreover, the substrate surface is reflected or duplicated in the outer surface of the deposited coating layer. These results are achieved even without any after-machining or other after-finishing of the deposited coating layer.

Furthermore, the highest possible measure of homogeneity and reproducibility of the coating layers, their properties, and their compositions is achieved. Also, the highest possible adhesion of the deposited coating layers onto the substrate is ensured by the high specific energy densities of the coating materials in the gas or plasma phase from which they are deposited.

The present method may be applied with great flexibility even in applications involving extreme deposition geometries, for example the geometries of combustion chamber internal contours. This flexibility of the inventive method and apparatus for carrying out the method is achieved due to the spatial separation of the coating zone from the externally positionable energy sources, i.e. the primary and auxiliary laser sources. Furthermore, the possibility of carrying out a precise local coating of the smallest possible areas of an internal surface should not be underestimated. In this context, the present method can be used as a renovation or repair method for recoating, restoring, or repairing particular damaged areas of a rocket combustion chamber. Such a repair procedure achieves a considerable cost reduction in comparison to a complete recoating of the entire interior of the combustion chamber.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of forming at least one coating layer containing at least one of a metal and a ceramic on an inner wall surface of a hollow body, comprising the following steps:
   a) arranging said hollow body in a deposition chamber;
   b) arranging a target of at least one target material comprising at least one of a metal and a ceramic in said deposition chamber;
   c) creating a reduced pressure within said deposition chamber;
   d) providing a controlled residual gas atmosphere within said deposition chamber;
   e) directing a pulsed laser beam to impinge on said target, vaporize a portion of said target material and form a plasma of said vaporized target material in said deposition chamber;
   f) condensing said plasma and depositing said target material from said plasma onto an area of an inner wall surface of said hollow body to form at least one coating layer comprising said target material on said area of said inner wall surface; and
   g) simultaneously directing an auxiliary laser beam to impinge onto said coating layer that is being formed or has previously been formed on said inner wall surface.

2. The method according to claim 1, wherein said auxiliary laser beam is directed in said step g) to impinge onto said coating layer directly at said area at which said coating layer is being formed in said step f).

3. The method according to claim 1, wherein said auxiliary laser beam is directed in said step g) to impinge onto said coating layer that has previously been formed at a location displaced away from said area at which said coating layer is being formed in said step f).

4. The method according to claim 1, further comprising generating both said pulsed laser beam and said auxiliary laser beam from a single laser source.

5. The method according to claim 1, further comprising respectively generating said pulsed laser beam and said auxiliary laser beam from two separate laser sources.

6. The method according to claim 1, further comprising generating at least said pulsed laser beam from a first laser source located outside of said deposition chamber, wherein said target is located within a hollow interior of said hollow body bounded by said inner wall surface, and wherein said step of directing said pulsed laser beam comprises directing said pulsed laser beam from said first laser source, through a laser window provided in a wall of said deposition chamber, and into said deposition chamber so as to impinge onto said target.

7. The method according to claim 1, wherein said plasma comprises a defined plasma jet particularly directed at said area of said inner wall surface.

8. The method according to claim 1, wherein said pulsed laser beam comprises pulses with a pulse energy in a range from 1 to 2 Joules and a pulse repetition rate in a range from 10 to 50 Hz, and further comprising determining and controlling an energy density and a material flux density of said plasma as a function of the spacing distance of a condensation zone from said inner wall surface.

9. The method according to claim 1, further comprising controlling a pulse duration of pulses of said pulsed laser beam and controlling a composition and concentration density of said residual gas atmosphere, such that said coating layer being formed has a desired g rain structure selected from among glassy amorphous structures, columnar grain structures and polycrystalline grain structures.

10. The method according to claim 1, wherein said target consists of both insulating and conducting substances.

11. The method according to claim 1, wherein said target is arranged movably in three-dimensions relative to said hollow body, and further comprising moving said target in said three-dimensions relative to said hollow body so as to scan said area at which said coating layer is formed along said inner wall surface.

12. The method according to claim 11, further comprising scanning said auxiliary laser beam along said inner wall surface by redirecting said auxiliary laser beam in three dimensions relative to said hollow body.

13. The method according to claim 12, wherein said moving of said target and said redirecting of said auxiliary laser beam relative to said hollow body are carried out by means of respective computer controlled stepper motors.

14. The method according to claim 1, further comprising discretely varying at least one process parameter selected from among an energy density of at least one of said pulsed laser beam and said auxiliary laser beam, a pulse duration of at least one of said pulsed laser beam and said auxiliary laser beam, and at least one of a concentration and a composition of said residual gas atmosphere, while continuing to carry out said method, so as to a deposit a plurality of said coating layers stacked on one another to form a multilayer coating system having discretely varying properties through a stacked thickness thereof.

15. The method according to claim 14, wherein said discretely varying properties comprise at least one of a crystal structure, a grain a structure, and a grain size.

16. The method according to claim 1, further comprising continuously varying at least one process parameter selected from among an energy density of at least one of said pulsed laser beam and said auxiliary laser beam, a pulse duration of at least one of said pulsed laser beam and said auxiliary laser beam, and at least one of a concentration and a composition of said residual gas atmosphere, while continuing to carry out said method, so as to deposit said coating layer having continuously varying properties through a layer thickness thereof.

17. The method according to claim 16, wherein said continuously varying properties comprise at least one of a crystal structure, a grain structure, and a grain size.

18. The method according to claim 1, wherein a laser treatment zone in which said auxiliary laser beam impinges on said coating layer has a size defined by a wavelength-dependent absorption depth of said auxiliary laser beam into a surface of said coating layer and by a beam cross-sectional area of said auxiliary laser beam impinging on said coating layer.

19. The method according to claim 1, wherein said inner wall surface of said hollow body comprises a metal and said target material deposited to form said coating film comprises a ceramic.

20. The method according to claim 1, wherein said hollow body has a length greater than 500 mm and an inner diameter less than 10 mm.

21. The method according to claim 1, wherein said hollow body is closed at a first end and open at a second end, and wherein said pulsed laser beam and said auxiliary laser beam are directed into said hollow body and said target is supported in said hollow body through said open second end.

22. The method according to claim 1, wherein said target has a generally conical shape, and further comprising rotating said target relative to said pulsed laser beam.

23. The method according to claim 1, carried out so as to form said coating layer to a total thickness of more than 20 $\mu$m and up to 100 $\mu$m.

* * * * *